(12) United States Patent
Ahn et al.

(10) Patent No.: US 7,200,067 B2
(45) Date of Patent: Apr. 3, 2007

(54) PAD ARRANGEMENT IN SEMICONDUCTOR MEMORY DEVICE AND METHOD OF DRIVING SEMICONDUCTOR DEVICE

(75) Inventors: Mee-Hyun Ahn, Seoul (KR); Jung-Bae Lee, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/895,554

(22) Filed: Jul. 21, 2004

(65) Prior Publication Data

US 2004/0256641 A1    Dec. 23, 2004

Related U.S. Application Data

(62) Division of application No. 10/054,700, filed on Jan. 17, 2002, now Pat. No. 6,806,582.

(30) Foreign Application Priority Data

Jan. 18, 2001   (KR) ................. 2001-2951

(51) Int. Cl.
*G11C 9/00* (2006.01)
(52) U.S. Cl. ............. 365/230.03; 365/191; 365/189.04
(58) Field of Classification Search ........... 365/230.03, 365/189.03, 189.04
See application file for complete search history.

(56) References Cited

U.S. PATENT DOCUMENTS 5,712,827 A * 1/1998 Ogihara et al. ........ 365/230.03
6,041,013 A * 3/2000 Kohno ................. 365/230.03
6,052,773 A * 4/2000 DeHon et al. ............... 712/43
6,075,743 A * 6/2000 Barth et al. .......... 365/230.01
6,134,172 A * 10/2000 Barth et al. .......... 365/230.03
6,134,179 A * 10/2000 Ooishi ..................... 365/233
6,169,699 B1 * 1/2001 Muraoka .............. 365/230.03
RE37,427 E * 10/2001 Ogihara et al. ........ 365/230.03
6,310,815 B1 * 10/2001 Yamagata et al. ..... 365/230.03
6,317,377 B1 * 11/2001 Kobayashi ............... 365/220
6,531,404 B1 * 3/2003 Nallan et al. ........ 257/E21.311
6,569,727 B1 * 5/2003 Casper et al. ............. 365/174
7,061,941 B1 * 6/2006 Zheng ...................... 370/535
2002/0105097 A1 * 8/2002 Ahn et al. ................. 257/786

* cited by examiner

*Primary Examiner*—Thong Q. Le
(74) *Attorney, Agent, or Firm*—F. Chau & Associates, LLC

(57) ABSTRACT

A semiconductor memory device comprising control pads and input/output I/O pads capable of reducing the data path for reading and writing data in a cell array, and a method for driving the semiconductor memory device are included. The semiconductor memory device comprises a plurality of memory banks arranged at a cell region of a memory chip, and a plurality of control pads and a plurality of I/O pads, separately arranged from each other at the memory chip, for reading/writing data from/in the memory banks, wherein the plurality of control pads and I/O pads are dispersed at the peripheral region between adjacent memory banks and at the outer portions of the memory banks.

4 Claims, 2 Drawing Sheets

PAD ARRANGEMENT IN SEMICONDUCTOR MEMORY DEVICE AND METHOD OF DRIVING SEMICONDUCTOR DEVICE

CROSS-REFERENCE TO RELATED APPLICATIONS

This application is a Divisional of U.S. application Ser. No. 10/054,700 filed on Jan. 17, 2002, now U.S. Pat. No. 6,806,582, which claims priority to Korean Application No. 01-2951 filed on Jan. 18, 2001.

BACKGROUND

1. Technical Field

The present invention generally relates to a semiconductor memory device comprising control pads and I/O (input/output) pads, and more particularly, to a semiconductor memory device comprising control pads and input/output I/O pads that are arranged on a memory chip to thereby reduce the length of data paths for reading/writing data from/in a cell array, and to a method for driving the semiconductor memory device.

2. Description of Related Art

A semiconductor memory device comprises data paths for reading/writing data from/to a cell array. The data paths extend from control pads to I/O pads through a memory cell within a memory chip. The length of a data path is determined by the arrangement of chip pads, e.g., control pads or I/O pads).

FIG. 1 is a diagram illustrating an arrangement of control pads and I/O pads in a conventional semiconductor memory device. In FIG. 1, a conventional semiconductor memory device comprises a plurality of memory banks BA11–BA14 arranged at the central region of a memory chip 10, each of the memory banks comprising a plurality of memory cells, and a plurality of control pads CPAD1 and a plurality of I/O pads IOPAD1 sequentially arranged in a region between adjacent memory banks of the memory chip 10.

The conventional semiconductor memory device can only read/write the data stored/to be stored in one of the memory banks BA11–BA14 from/in the corresponding memory bank. For example, the data stored (or the data to be stored) in the first memory bank BA11 can only be read/written from/in the first memory bank BA11. Similarly, the data stored/to be stored the second, third, and fourth memory banks BA12, BA13, BA14 can only read/written from/in the second, third, and fourth memory bank BA12, BA13, BA14, respectively.

The memory banks BA11–BA14 commonly share the plurality of control pads CPAD1 and the plurality of I/O pads IOPAD1 for controlling the reading/writing operations of the semiconductor memory device. That is, the data stored/to be stored in one of the memory banks BA11–BA14 is read/written in the corresponding memory bank through all the control pads CPAD1 and the I/O pads IOPAD1. Accordingly, the conventional semiconductor memory device has a disadvantage in that data paths become longer.

Further, since the control pads CPAD1 and the I/O pads IOPAD1 arranged in the region between adjacent memory banks of the memory chip 10, another disadvantage is that the data path for reading/writing data in a given memory cell become longer than the data path in another memory cell.

For example, when the data stored in memory cell CE1 of the first memory bank BA11 is read from the first memory bank BA11, the data is supplied from the memory cell CE1 to the I/O pads IOPAD1 through a first path DP11. And then, the signal for reading data is applied from the control pad CPAD1 to the memory cell CE1 of the first memory bank BA11 though a second path DP12. In contrast, when the data to be stored in the memory cell CE1 of the first memory bank BA11 is written in the first memory bank BA11, the data is supplied from the I/O pad IOPAD1 to the memory cell CE1 through the first path DP11. Then, the signal for writing data is applied from the control pad CPAD1 to the memory cell CE1 of the first memory bank BA11 through the second path DP12. Accordingly, the length of the data path for reading or writing data is the sum of lengths of the first path DP11 and the second path DP12. Thus, a conventional semiconductor memory device having an architecture as shown in FIG. 1 have long data paths.

Furthermore, the conventional semiconductor memory device of FIG. 1 has a disadvantage in that the length of the data path in the chip becomes longer as the memory capacity increases. The data path in the inside of the chip is the distance from the control pad CPAD1 to the I/O pad IOPAD1 through a memory cell.

Another conventional semiconductor memory device design comprises an arrangement of I/O pads and control pads at the edge portion of a memory chip in which memory banks are located at the central portion of the memory chip. However, such a pad arrangement also has a disadvantage that the data path is long.

SUMMARY OF THE INVENTION

To overcome disadvantages of conventional pad arrangements in semiconductor memory devices, it is object of the present invention to provide a semiconductor memory device capable of reducing the data paths for writing/reading data.

It is another object of the present invention to provide a semiconductor memory device comprising control pads and I/O pads separately arranged from each other, thereby reducing the data paths for reading/writing data.

It is another object of the present invention to provide a semiconductor memory device capable of reducing the data paths for reading/writing data and having a uniform length of the data path irrespective of location of a written/read memory cell.

It is further object of the present invention to provide a method for driving a semiconductor memory device capable of reducing the data path for reading/writing data in the semiconductor memory device.

In one aspect of the present invention, a semiconductor memory device, comprises:

a plurality of memory banks; and a plurality of control pads and a plurality of I/O (input/output) pads for reading data from and writing data in the memory banks, wherein the plurality of control pads and I/O pads are disposed in a region between adjacent memory banks and in a peripheral region surrounding the memory banks.

In another aspect of the present invention, a semiconductor memory device comprises:

a plurality of memory banks arranged at a cell region of a memory chip; and a plurality of control pads and a plurality of I/O (input/output) pads, separately arranged from each other in the memory chip, for reading data from and writing data in the memory banks, wherein the plurality of control pads are sequentially arranged in a region between adjacent memory banks of the memory chip and the plurality of I/O pads are dispersed in a periphery region surrounding the memory banks.

In yet another aspect of the present invention, a semiconductor memory device comprises:

a plurality of memory banks arranged at a cell region of a memory chip; and a plurality of control pads and a plurality of I/O (input/output) pads for reading data from and writing data in the plurality of memory banks, wherein the plurality of control pads are sequentially arranged in a region between adjacent memory banks and are commonly shared by the plurality of memory banks, and wherein a predetermined number of I/O pads of the plurality of I/O pads are arranged in a periphery region surrounding the memory banks and the plurality of I/O pads are commonly shared by the plurality of memory banks.

In another aspect of the present invention, a semiconductor memory device comprises:

a plurality of memory banks arranged at a cell region of a memory chip, each of the plurality of memory banks comprising a plurality of bank areas;

a plurality of control pads that are sequentially arranged in a region between adjacent memory banks and are commonly shared by the memory banks; and a plurality of I/O pads that are arranged in a peripheral region surrounding the memory banks and are commonly shared by memory banks.

In yet another aspect of the present invention, a semiconductor memory device comprises:

a plurality of memory banks arranged at a cell region of a memory chip; and a plurality of control pads and a plurality of I/O (input/output) pads for reading data from and writing data in the memory banks, wherein each of the plurality of memory banks comprises a plurality of bank areas, wherein the number of bank areas corresponds to the number of the plurality of memory banks and the data corresponding to one of the plurality of bank areas is read from or written in the corresponding bank area of each of the memory banks, wherein the plurality of control pads are sequentially arranged in a region between adjacent memory banks and are commonly shared by the plurality of memory banks, wherein the plurality of I/O pads are arranged in a peripheral region surrounding the memory banks and are commonly shared by the plurality of memory banks, and wherein a predetermined number of I/O pads are allocated to the outer potion of each of the memory banks.

In another aspect of the present invention, a method is provided for driving data in a semiconductor memory device comprising a plurality of memory banks arranged at a cell region of a memory chip, each of the memory banks comprising a plurality of bank areas in which the number of bank areas corresponds to the number of the memory banks, a plurality of control pads sequentially arranged in a region between adjacent memory banks of the memory chip, and a plurality of I/O pads arranged in a peripheral region surrounding the memory banks, in which a predetermined number of I/O pads are allocated to each memory bank and are disposed near the corresponding memory bank in the perpherial region surrounding the memory banks. The method comprising the steps of:

writing data to be stored in a bank area of a memory bank through the plurality of control pads and the predetermined number of I/O pads allocated to the corresponding memory bank; and reading data stored in a bank area of a memory bank through the plurality of control pads and the predetermined number of I/O pads allocated to the corresponding memory bank.

These and other aspects, features and advantages of the present invention will be described and become apparent from the following detailed description of preferred embodiments, which is to be read in connection with the accompanying drawings.

DETAILED DESCRIPTION OF PREFERRED EMBODIMENTS

Figure 2:
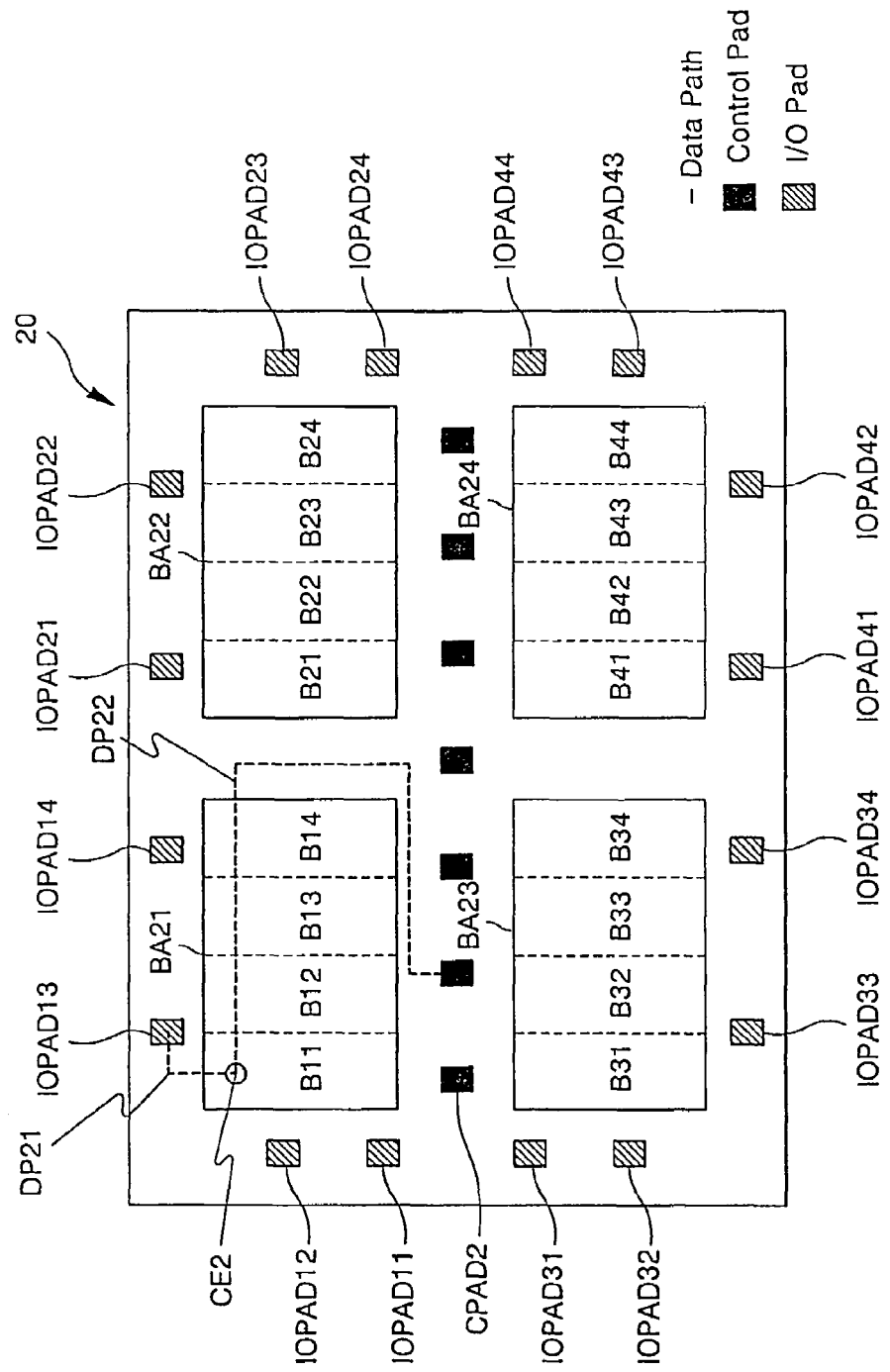
FIG. 2 is a block diagram illustrating an arrangement of control pads and I/O pads of a semiconductor memory device according to an embodiment of the present invention.

FIG. 2 is a diagram illustrating the arrangement of control pads and I/O pads of a semiconductor memory device according to a preferred embodiment of the present invention. Referring to FIG. 2, a semiconductor memory device comprises a plurality of memory banks BA21–BA24 arranged at the central cell region of a memory chip 20, a plurality of control pads CPAD2 arranged at the peripheral region between adjacent memory banks, and a plurality of I/O pads IOPAD that are separately arranged from the control pads CPAD2 and dispersed in a periphery region surrounding the memory banks BA21–BA24 (or the outer portion of the memory chip 20). Each of the memory banks BA21–BA24 comprises a plurality of memory cells.

Preferably, the control pads CPAD2 are sequentially arranged at the peripheral region between adjacent memory banks (e.g., between memory banks BA21, BA22 and memory banks BA23, BA24) of memory chip 20. Moreover, the I/O pads IOPAD are arranged in the periphery region surrounding the memory banks which in FIG. 2 is the edge portions of the memory chip 20. The plurality of I/O pads are grouped by a predetermined number of I/O pads and the I/O pad groups are allocated to the outer portion of each of the memory banks.

For example, in the exemplary embodiment of FIG. 2, the number of I/O pads is sixteen and the number of memory banks is four, and the sixteen I/O pads are grouped by four I/O pads (e.g., IOPAD11–IOPAD14, IOPAD21–IOPAD24, IOPAD31–IOPAD34, and IOPAD41–IOPAD44) and each group is allocated to one of the outer portions of the memory banks BA21–BA24.

Preferably, for each of the memory banks to commonly share the sixteen I/O pads IOPAD11–14, IOPAD21–24, IOPAD31–34 and IOPAD41–44, each of the memory banks BA21–BA24 are divided into a plurality of bank areas. Preferably, the number of bank areas of each memory bank corresponds to the number of the memory banks of the memory chip 20. For example, as shown in FIG. 2, since the memory chip 20 comprises four memory banks (BA21, B22, B23, B24), the memory banks each comprise four bank areas: (B11, B12, B13, B14), (B21, B22, B23, B24), (B31, B32, B33, B34) and (B41, B42, B43, B44). Therefore, each memory bank BA21–BA24 comprises a memory bank that belongs to each assigned bank area.

Figure 1:
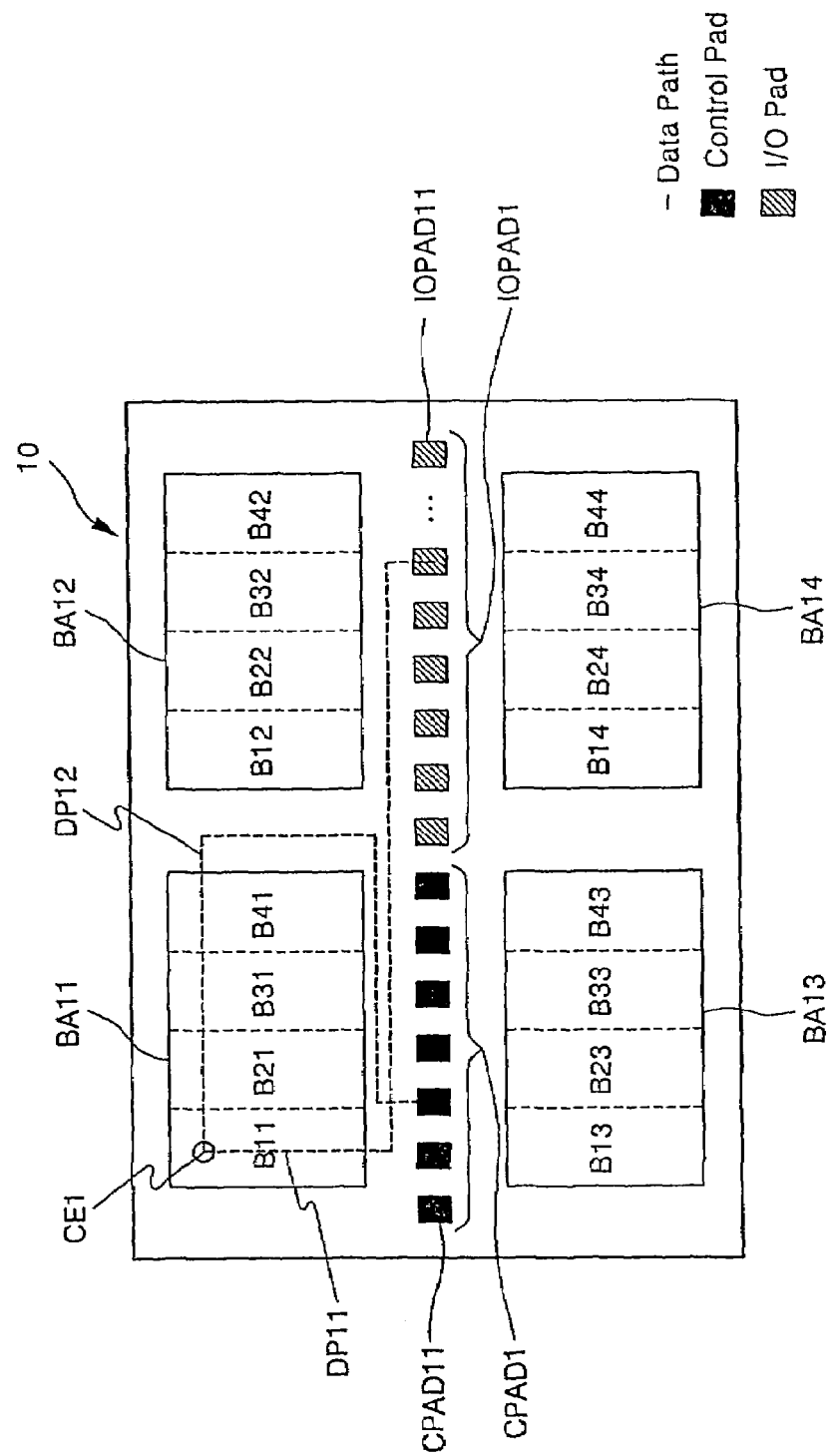
FIG. 1 is a block diagram illustrating an arrangement of control pad and I/O pads of a conventional semiconductor memory device.

In contrast to the conventional architecture of FIG. 1, the memory banks BA11–BA14 are not divided into bank areas such as the memory banks as described above with reference to FIG. 2. By way of example, comparing the memory banks of FIGS. 1 and 2, the memory bank BA21 in FIG. 2 comprises bank areas B11, B12, B13 and B14. As shown in FIG. 1, however, bank area B11 belongs to memory bank BA11, bank area B12 belongs to memory bank BA12, bank area B13 belongs to memory bank BA13 and bank area B14 belongs to memory bank BA14.

In the conventional semiconductor memory device of FIG. 1, the data corresponding to a given memory bank is only read/written from/in to the memory bank. For example, the data corresponding to the first memory bank BA11 is only read/written from/in the banks B11–B41, the data corresponding to the memory bank BA12 is only read/written from/in the banks B12–B42, the data corresponding to the third memory bank BA13 is only read/written from/in the banks B13–B43, and the data corresponding to the fourth memory bank BA14 is only read/written from/in the banks B14–B44.

Thus, in the conventional semiconductor memory device of FIG. 1, the data is read/written from/to a corresponding memory bank during read/write operation using the plurality of control pads and the plurality of I/O pads arranged at the peripheral region of the memory chip 10, thereby resulting in longer data paths.

In contrast, in the exemplary embodiment of FIG. 2, each of the memory banks BA21–BA24 comprise four bank areas (i.e., first to fourth bank areas). The data corresponding to the first bank area is read/written from/in the first set of bank areas B11, B21, B31, B41 of the four memory banks BA21–BA24, respectively. Similarly, the data corresponding to the second bank area is read/written from/in the second set of bank areas B12, B22, B32, B42 of the four memory banks BA21–BA24, respectively, the data corresponding to the third bank area is read/written from/in the third set of bank areas B13, B23, B33, B43 of the four memory banks BA21–BA24, respectively, and the data corresponding to the fourth area is read/written from/in the fourth set of bank areas B14, B24, B34, B44 of the four memory banks BA21–BA24, respectively.

In the exemplary embodiment of FIG. 2, the semiconductor memory 20 comprises four memory banks BA21–BA24 that each comprise four bank areas B11–B14, B21–B24, B31–B34, and B41–B44, respectively, and a plurality of I/O pads (e.g., the sixteen I/O pads) dispersed at the outer portions of the memory banks BA21–BA24. Therefore, the semiconductor memory device reads/writes the data corresponding to one of the first to fourth bank areas from/in the four memory banks BA 2–BA24 through the plurality of control pads arranged at the peripheral region between adjacent memory banks and the I/O pads allocated to each of the memory banks.

Each of the memory banks BA11–BA14 of the conventional semiconductor memory device of FIG. 1 reads and writes data through sixteen I/O pads IOPAD1. On the contrary, each of the memory banks BA21–BA24 of the exemplary semiconductor memory device of FIG. 2 reads/writes data only through four designated I/O pads arranged in the periphery region of the memory bank. For example, the memory bank BA21 reads/writes data through four I/O pads IOPAD11–IOPAD14.

However, because each of the memory banks BA21–BA24 comprise four bank areas, even if the data corresponding to one of four bank areas is read/written from/in the four memory banks BA21–BA24, the semiconductor memory device of FIG. 2 can read/write the data corresponding to the entire memory banks BA11–BA14 of FIG. 1. For example, when the data stored/to be stored in the first memory bank BA21 of FIG. 2 is read/written from the first memory bank BA21, the data corresponding to the first to the fourth bank areas (that is, the entire data of the memory banks BA11–BA14 of FIG. 1) is read/written from/in the first memory bank BA21. Therefore, in accordance with the present invention, the process of reading/writing data from/in a memory bank drives all of the memory banks of a conventional semiconductor memory device. Accordingly, each of the memory banks BA21–BA24 of FIG. 2 commonly shares the sixteen I/O pads of the memory chip 20.

The semiconductor memory device of FIG. 1 reads and writes data through the sixteen I/O pads IOPAD1 in the case of reading/writing data from/in the first memory bank BA11. However, the semiconductor memory device of FIG. 2 reads and writes data through the four I/O pads IOPAD11–IOPAD14 in the case of reading/writing data from/in the first memory bank BA21. Similarly, data is read/written from/in the second memory bank BA22 through the four I/O pads IOPAD21–IOPAD24. Data is read/written from/in the third memory bank BA23 through the four I/O pads IOPAD31–IOPAD34. Data is read/written from/in the fourth memory bank BA24 through the four I/O pads IOPAD41–IOPAD44.

However, when the semiconductor memory device of FIG. 2 reads/writes data from/in one of the four bank areas, the device employs the sixteen I/O pads because data is read/written from/in the corresponding bank area of each memory bank through each four I/O pads arranged at the each memory bank. Then, the semiconductor memory device employs all of the plurality of control pads CPAD2 commonly shared by the memory banks.

For example, in the device of FIG. 2, if data is read/written from/in the first bank area, firstly, data is read/written from/in the first bank area B11 of the first memory bank BA21 through the I/O pads IOPAD11–IOPAD14. And then, data is read/written from/in the second, third, and fourth bank areas B21, B31 and B41 of the second, third, and fourth memory banks BA22, BA23, and BA24, through the I/O pads IOPAD21–IOPAD24, IOPAD31–IOPAD34, and IOPAD41–IOPAD44, respectively.

That is, since the data corresponding to the first memory bank BA11 of FIG. 1 is stored in the first bank area comprising B11–B41 of each of the memory banks BA21–BA24 of FIG. 2, the data is read/written from/in the four memory banks BA21–BA24 through the sixteen pads. Similarly, the data corresponding to the other memory bank areas is read/written from/in the memory banks BA21–BA24 through the shared sixteen pads, respectively.

A semiconductor memory device according to a preferred embodiment of the present invention disperses a plurality of I/O pads at the surrounding areas of a plurality of memory banks. For example, a semiconductor memory device allocates four I/O pads of sixteen I/O pads at the surrounding area of one of four memory banks. Each of the memory banks comprises four bank areas and the data corresponding to one of four memory banks can be read/written from/in only one memory bank, thereby reducing the length of data path.

In the exemplary embodiment of FIG. 2, the memory chip 20 comprises four memory banks BA21–BA24, each comprising four bank areas, and sixteen I/O pads, in which every four I/O pads are allocated at the outer portion of each memory bank. It is understood that the architecture depicted in FIG. 2 could be modified and changed without any limitation. Further, each of the memory banks may comprise the different number of bank areas.

In the exemplary embodiment of FIG. 2, when a signal for reading data is applied from control pad CPAD2 to memory cell CE2 of the first bank area B11 of the first memory bank BA21 via path DP22, the data read from memory cell CE2 is supplied to a I/O pad IOPAD13 via path DP21. Further, when a signal for writing data is applied from control pad CPAD2 to the memory cell CE2 of the first bank area B11 of the first memory bank BA21 via path DP22, the data to be written is supplied to memory cell CE2 from the I/O pad IOPAD13 via the path DP21.

Because the length of data path in the inside of the memory chip 20 is determined by the lengths of the reading and writing data paths, i.e., paths DP21 and DP22, a semiconductor memory device according to the present invention has a shorter data path than the data path of a conventional semiconductor memory device (as shown in FIG. 1).

Advantageously, a semiconductor memory device according to a preferred embodiment of the present invention comprises the control pads and the I/O pads separately arranged to each other, thereby reducing the lengths of the reading/writing data paths. Further, the semiconductor memory device comprises a plurality of memory banks comprising a plurality of bank areas, thereby maintaining the length of data paths in the inside of the memory chip even the increasing of the memory capacity.

Therefore, a semiconductor memory device according to an embodiment of the present invention has a similar length of the data path for reading/writing data from/in any cell of each memory bank. Accordingly, the length of the data paths in the semiconductor memory device can be effectively reduced with the increasing of the memory capacity.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for driving data in a semiconductor memory device comprising a plurality of memory banks arranged at a cell region of a memory chip, each of the memory banks comprising a plurality of bank areas in which the number of bank areas corresponds to the number of the memory banks, a plurality of control pads sequentially arranged in a region between adjacent memory banks of the memory chip, and a plurality of I/O pads arranged in a peripheral region surrounding the memory banks, in which a predetermined number of I/O pads are allocated to each memory bank and are disposed near the corresponding memory bank in the peripheral region surrounding the memory banks, the method comprising the steps of:

writing data to be stored in a bank area of a memory bank through the plurality of control pads and the predetermined number of I/O pads allocated to the corresponding memory bank; and reading data stored in a bank area of a memory bank through the plurality of control pads and the predetermined number of I/O pads allocated to the corresponding memory bank.

2. A method for driving data in a semiconductor memory device, the method comprising:

reading data from and writing data in a plurality of memory banks through a plurality of I/O pads and a plurality of control pads, wherein the plurality of I/O pads are disposed in a peripheral region surrounding the plurality of memory banks and the plurality of control pads are disposed in a region between memory banks.

3. The method of claim 2, wherein the plurality of control pads are sequentially arranged in the region between memory banks.

4. The method of claim 2, wherein each of the plurality of memory banks comprises a plurality of bank areas, each of the plurality of bank areas corresponds to a memory bank.

* * * * *